US009419053B2

(12) United States Patent
Hsu

(10) Patent No.: US 9,419,053 B2
(45) Date of Patent: Aug. 16, 2016

(54) RESISTIVE RANDOM ACCESS MEMORY STRUCTURE AND METHOD FOR OPERATING RESISTIVE RANDOM ACCESS MEMORY

(71) Applicant: Powerchip Technology Corporation, Hsinchu (TW)

(72) Inventor: Mao-Teng Hsu, Taipei (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 14/601,252

(22) Filed: Jan. 21, 2015

(65) Prior Publication Data

US 2016/0148978 A1    May 26, 2016

(30) Foreign Application Priority Data

Nov. 25, 2014   (TW) .............................. 103140770 A

(51) Int. Cl.
*G11C 5/06* (2006.01)
*H01L 27/24* (2006.01)
*G11C 13/00* (2006.01)

(52) U.S. Cl.
CPC .......... *H01L 27/2436* (2013.01); *G11C 13/004* (2013.01); *G11C 13/0069* (2013.01); *G11C 13/0097* (2013.01)

(58) Field of Classification Search
CPC ... G11C 13/0002; G11C 2213/79; G11C 8/16
See application file for complete search history.

(56) References Cited

U.S. PATENT DOCUMENTS

| 6,531,371 | B2 | 3/2003 | Hsu et al. | |
|---|---|---|---|---|
| 8,471,232 | B2 | 6/2013 | Kim et al. | |
| 8,673,692 | B2 | 3/2014 | Tan et al. | |
| 8,674,332 | B2 | 3/2014 | Toh et al. | |
| 2004/0165419 | A1* | 8/2004 | Tsuji ........................ | G11C 7/14 365/158 |
| 2004/0174732 | A1* | 9/2004 | Morimoto .......... | G11C 11/5685 365/148 |
| 2009/0086530 | A1* | 4/2009 | Chung ................... | G11C 11/16 365/158 |
| 2009/0207642 | A1* | 8/2009 | Shimano .................. | G11C 8/04 365/72 |
| 2012/0092941 | A1* | 4/2012 | Porter ............... | G11C 13/0004 365/189.15 |
| 2012/0236650 | A1* | 9/2012 | Nazarian ............ | G11C 13/0007 365/185.18 |
| 2012/0327701 | A1 | 12/2012 | Nazarian | |
| 2013/0240821 | A1 | 9/2013 | Toh et al. | |
| 2015/0213889 | A1* | 7/2015 | Miura ................. | G06F 12/0246 365/163 |

FOREIGN PATENT DOCUMENTS

TW   201019469   5/2010
TW   201349238   12/2013

OTHER PUBLICATIONS

Baek et al., "Realization of vertical resistive memory (VRRAM) using cost effective 3D process," IEEE International Electron Devices Meeting (IEDM), 2011, pp. 31.8.1-31.8.4.

(Continued)

*Primary Examiner* — Tuan T Nguyen
(74) *Attorney, Agent, or Firm* — Jianq Chyun IP Office

(57) ABSTRACT

A resistive random access memory (RRAM) structure including a first transistor, a second transistor and a RRAM cell string is provided. The first transistor and the second transistor are cascaded by electrically connecting a first terminal of the first transistor and the second transistor. The RRAM cell string includes a plurality of memory cells connected with each other and is electrically connected to a second terminal of the first transistor.

10 Claims, 4 Drawing Sheets

(56) References Cited

OTHER PUBLICATIONS

Chien et al., "Multi-layer sidewall WOX resistive memory suitable for 3D ReRAM," 2012 Symposium on VLSI Technology (VLSIT), 2012, pp. 153-154.

Zhang et al., "Analysis of vertical cross-point resistive memory (VRRAM) for 3D RRAM design," 5th IEEE International Memory Workshop (IMW), 2013, pp. 155-158.

Chen et al., "HfOx based vertical resistive random access memory for cost-effective 3D cross-point architecture without cell selector," IEEE International Electron Devices Meeting (IEDM), 2012, pp. 20.7.1-20.7.4.

"Office Action of Taiwan Counterpart Application", issued on May 17, 2016, pp. 1-5, in which the listed references were cited.

* cited by examiner

RESISTIVE RANDOM ACCESS MEMORY STRUCTURE AND METHOD FOR OPERATING RESISTIVE RANDOM ACCESS MEMORY

CROSS-REFERENCE TO RELATED APPLICATION

This application claims the priority benefit of Taiwan application serial no. 103140770, filed on Nov. 25, 2014. The entirety of the above-mentioned patent application is hereby incorporated by reference herein and made a part of this specification.

BACKGROUND OF THE INVENTION

1. Field of the Invention

The invention relates to a memory and a method for operating the same, and particularly relates to a resistive random access memory structure and a method for operating a resistive random access memory.

2. Description of Related Art

Since non-volatile memory has the advantage that the data does not disappear when the power is turned off, many electronic products require this kind of memory in order to function normally when the electronic products are turned on. Currently, one of the non-volatile memory devices that the industry has been actively working on is the resistive random access memory (RRAM). The RRAM has the advantages of low writing operation voltage, short writing and erasing time, long memorizing time, non-destructive reading, multi-state memory, simple structure, smaller required area. Thus, the RRAM has the potential of becoming one of the non-volatile memory devices broadly used in personal computers and electronic equipments in the future.

Currently, the industry has proposed a high density three-dimensional resistive random access memory. However, how to reduce the operational complexity, power consumption and current leakage of the three-dimensional resistive random access memory has now become an issue for the industry to work on.

SUMMARY OF THE INVENTION

The invention provides a resistive random access memory having a preferable electrical performance.

The invention provides a method for operating a resistive random access memory having a preferable operational performance.

The invention provides a resistive random access memory structure, including a first transistor, a second transistor, and a resistive random access memory string. By electrically connecting a first terminal of the first transistor with the second transistor, the first transistor and the second transistor are cascaded. The resistive random access memory cell string includes a plurality of memory cells electrically connected to each other, and is electrically connected to a second terminal of the first transistor.

According to an embodiment, in the resistive random access memory structure, the first transistor and the second transistor are cascaded by sharing the first terminal, for example.

According to an embodiment, in the resistive random access memory structure, the first transistor includes a first gate, a first doped region, and a second doped region. The first gate is disposed on the substrate. The first doped region and the second doped region are respectively disposed in the substrate at one side and another side of the first gate, and respectively serve as the first and second terminals. The second transistor includes a second gate, a third doped region, and the first doped region. The second gate is disposed on the substrate. The third doped region and the first doped region are respectively disposed in the substrate at one side and another side of the second gate. In addition, the third doped region serves as a third terminal.

According to an embodiment, in the resistive random access memory structure, the substrate includes a protruding portion. The protruding portion is located between the first gate and the second gate, and the first terminal is located in the protruding portion.

According to an embodiment, in the resistive random access memory structure, the first transistor and the second transistor are cascaded by electrically connecting the first terminal of the first transistor and a fourth terminal of the second transistor, for example.

According to an embodiment, in the resistive random access memory structure, the first transistor includes a first gate, a first doped region, and a second doped region. The first gate is disposed on the substrate. The first doped region and the second doped region are respectively disposed in the substrate at one side and another side of the first gate, and respectively serve as the first and second terminals. The second transistor includes a second gate, a third doped region, and a fourth doped region. The second gate is disposed on the substrate. The third doped region and the fourth doped region are respectively disposed in the substrate at one side and another side of the second gate, and respectively serve as a third terminal and a fourth terminal.

According to an embodiment, in the resistive random access memory structure, the first doped region and the fourth doped region are electrically connected through an interconnect structure, for example.

According to an embodiment, in the resistive random access memory structure, each of the memory cells includes a first electrode, a second electrode, and a variable resistance structure. The second electrode is disposed on the first electrode. The variable resistance structure is disposed between the first electrode and the second electrode.

According to an embodiment, in the resistive random access memory structure, the resistive random access memory cell string further includes an interconnect structure connecting the first electrodes of the memory cells of the same string.

According to an embodiment, in the resistive random access memory structure, the first transistor and the second transistor respectively include a metal oxide semiconductor field effect transistor, a bipolar junction transistor, a junction field effect transistor, a metal-semiconductor field effect transistor, or a modulation doped field effect transistor.

The invention provides a method for operating a resistive random access memory. In addition, the resistive random access memory includes at least one resistive random access memory structure. The resistive random access memory structure includes a first transistor, a second transistor, a resistive random access memory string, a first word line, a second word line, a plurality of bit lines, and a source line. By electrically connecting a first terminal of the first transistor with the second transistor, the first transistor and the second transistor are cascaded. The resistive random access memory cell string includes a plurality of memory cells electrically connected to each other, and is electrically connected to a second terminal of the first transistor. The first word line is electrically connected to a first gate of the first transistor. The second word line is electrically connected to a second gate of the second transistor. The bit lines are respectively electrically connected to the corresponding memory cells. The source line is electrically connected to a third terminal of the second transistor. In addition, the third terminal is located at a side of the second gate away from the first gate. The method for operating the resistive random access memory includes connecting the source line to a ground when performing one of a programming operation, an erasing operation, and a reading operation to a selected one of the memory cells.

According to an embodiment, in the method for operating the resistive random access memory, performing the programming operation to the selected memory cell further includes steps as follows. A first turn-on voltage is applied to the first word line. A second turn-on voltage is applied to the second word line. A programming voltage is applied to the bit line.

According to an embodiment, in the method for operating the resistive random access memory, performing the erasing operation to the selected memory cell further includes steps as follows. A third turn-on voltage is applied to the first word line. A fourth turn-on voltage is applied to the second word line. An erasing voltage is applied to the bit line.

According to an embodiment, in the method for operating the resistive random access memory, performing the reading operation to the selected memory cell further includes steps as follows. A fifth turn-on voltage is applied to the first word line. A sixth turn-on voltage is applied to the second word line. A reading voltage is applied to the bit line.

According to an embodiment, in the method for operating the resistive random access memory, an absolute value of a programming voltage of the programming operation is greater than an absolute value of an erasing voltage of the erasing operation, for example, and the absolute value of the erasing voltage is greater than an absolute value of a reading voltage of the reading operation, for example.

According to an embodiment, in the method for operating the resistive random access memory, when the number of the at least one resistive random access memory structure is plural, and an operation is performed to the selected memory cell, no voltage is applied to other first word lines, other second word lines, and other bit lines that are not connected to the selected memory cell.

According to an embodiment, in the method for operating the resistive random access memory, when the number of the at least one resistive random access memory structure is plural, and an operation is performed to the selected memory cell, other source lines that are not connected to the selected memory cell is connected to the ground.

Based on the above, in the resistive random access memory structure and the method for operating the resistive random access memory of the invention, the operational complexity, power consumption, and current leakage are significantly reduced by using two cascaded transistors to control the resistive random access memory cell string, thereby effectively improving electrical and operational performance of the resistive random access memory.

To make the above features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
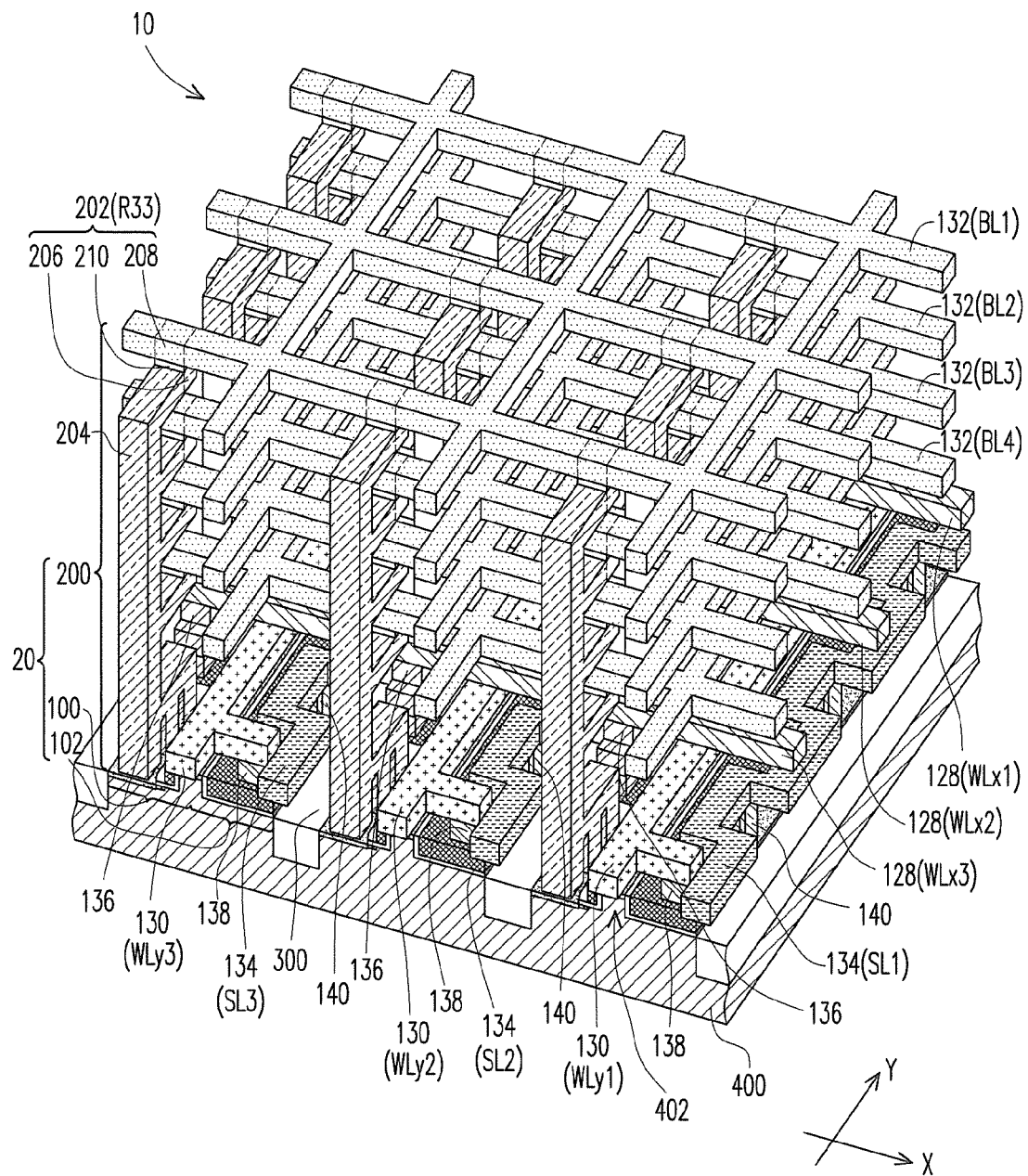
FIG. 1 is a perspective view illustrating a resistive random access memory according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
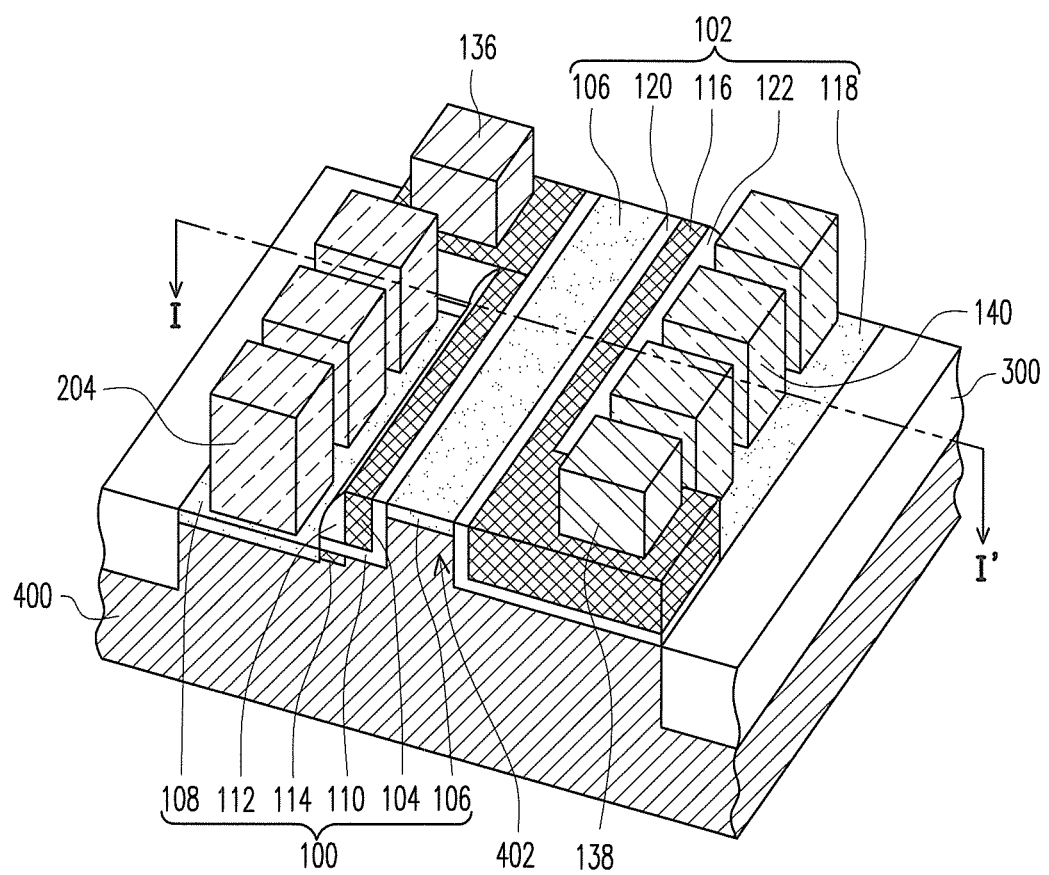
FIG. 2 is an enlarged view of a transistor structure shown in FIG. 1.
Figure 3:
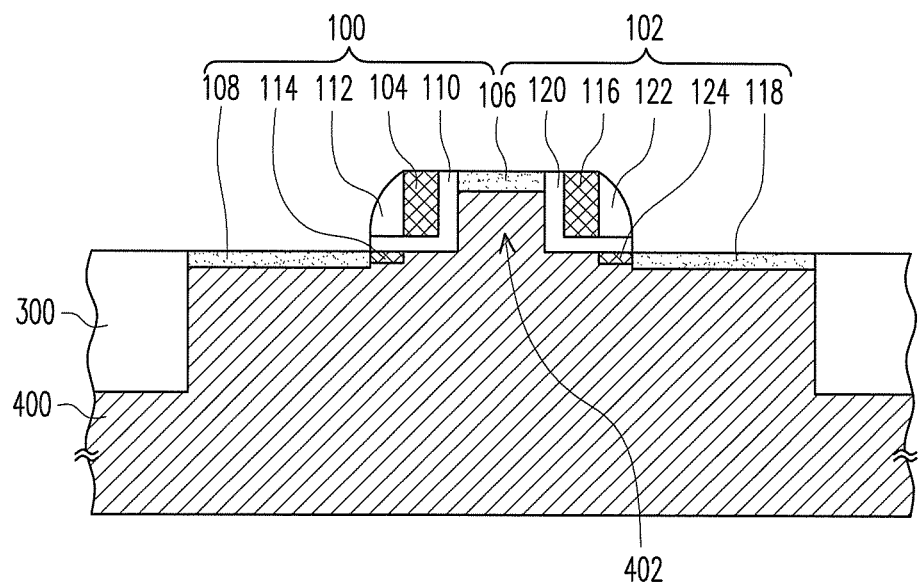
FIG. 3 is a cross-sectional view illustrating the transistor structure along an I-I' cross-sectional line shown in FIG. 2.

FIG. 1 is a perspective view illustrating a resistive random access memory according to an embodiment of the invention. Hollow portions shown in FIG. 1 are filled by a dielectric layer in the real practice. However, to clearly describe FIG. 1, the dielectric layer is omitted herein. In addition, regarding numbering of memory cells shown in FIG. 1, only a selected memory cell R33 is marked in order to clearly describe FIG. 1. FIG. 2 is an enlarged view of a transistor structure shown in FIG. 1. FIG. 2 illustrate a portion of an interconnect structure to illustrate a connection relation between the transistor and the interconnect structure. FIG. 3 is a cross-sectional view illustrating the transistor structure along an I-I' cross-sectional line shown in FIG. 2.

Referring to FIGS. 1 to 3 together, a resistive random access memory 10 includes at least one resistive random access memory structure 20. In this embodiment, nine resistive random access memory structures 20 are described as an example. However, people having ordinary skills in the art may adjust the number of the resistive random access memory structures 20 according to the design requirements of the product.

Each of the resistive random access memory structures 20 includes a first transistor 100, a second transistor 102, and a resistive random access memory cell string 200. By electrically connecting a first terminal (e.g. a first doped region 106 shown in FIG. 2) of the first transistor 100 with the second transistor 102, the first transistor 100 and the second transistor 102 are cascaded. The resistive random access memory cell string 200 includes a plurality of memory cells 202 that are electrically connected to each other. In addition, the resistive random access memory cell string 200 is electrically connected to a second terminal (e.g. a second doped region 108 shown in FIG. 2) of the first transistor 100. In addition, active regions of two adjacent resistive random access memory structures 20 are isolated from each other by using an isolation structure 300. The isolation structure 300 is a shallow trench isolation (STI) structure, for example.

The first transistor 100 and the second transistor 102 are respectively a metal oxide semiconductor field effect transistor (MOSFET), a bipolar junction transistor, a junction field effect transistor, a metal-semiconductor field effect transistor, or a modulation doped field effect transistor, for example. The resistive random access memory cell string 200 is a vertical connecting resistive random access memory cell string or a horizontal connecting resistive random access memory cell string, for example. However, the invention does not intend to limit a configuration of the resistive random access memory cell string 200. In this embodiment, the first transistor 100 and the second transistor 102 are described as MOSFETs, for example, and the resistive random access memory cell string 200 is described as a vertical connecting resistive random access memory cell string, for example. However, the invention is not limited thereto.

In this embodiment, the first transistor 100 and the second transistor 102 are cascaded to each other by sharing the first doped region 106 (first terminal), for example.

The first transistor 100 includes a first gate 104, the first doped region 106, and a second doped region 108. The first gate 104 is disposed on a substrate 400. The first doped region 106 and the second doped region 108 are respectively disposed in the substrate 400 at one side and another side of the first gate 104, and respectively serve as the first and second terminals. In addition, the first transistor 100 may selectively include at least one of a gate dielectric layer 110, a spacer 112, and a doped extension region 114. The gate dielectric layer 110 is disposed between the first gate 104 and the substrate 400. The spacer 112 is disposed on a sidewall at a side of the first gate 104. The doped extension region 114 is disposed in the substrate 400 under the spacer 112, and may serve as a lightly doped drain (LDD). Materials and manufacturing methods of the components in the first transistor 100 are already well-known by people having ordinary skills in the art. Thus, details in this respect will not be further reiterated below.

The second transistor 102 includes a second gate 116, a third doped region 118, and the first doped region 106. The second gate 116 is disposed on the substrate 400. The third doped region 118 and the first doped region 106 are respectively disposed in the substrate 400 at one side and another side of the second gate 116. In addition, the third doped region 118 serves as a third terminal. In addition, the second transistor 102 may selectively include at least one of the gate dielectric layer 120, the spacer 122, and the doped extension region 124. The gate dielectric layer 120 is disposed between the second gate 116 and the substrate 400. The spacer 122 is disposed on a sidewall at a side of the second gate 116. The doped extension region 124 is disposed in the substrate 400 under the spacer 122, and may serve as a lightly doped drain (LDD). Materials and manufacturing methods of the components in the second transistor 102 are already well-known by people having ordinary skills in the art. Thus, details in this respect will not be further reiterated below.

In addition, the substrate 400 includes a protruding portion 402. The protruding portion 402 is located between the first gate 104 and the second gate 116. In addition, the first doped region 106 (the first terminal) is located in the protruding portion 402. When the first transistor 100 and the second transistor 102 shown in FIGS. 2 and 3 are used, the first transistor 100 and the second transistor 102 only take up a wafer area slightly greater than an area that a planar-type MOSFET takes up. Therefore, utilization of the wafer area is effectively improved.

In addition, a configuration of the transistor structure that the resistive random access memory 20 uses is not limited to the first transistor 100 and the second transistor 102 in this embodiment. A configuration is in the scope of the invention as long as two transistors are cascaded to each other and adapted to control operation of the resistive random access memory cell string 200.

Figure 4:
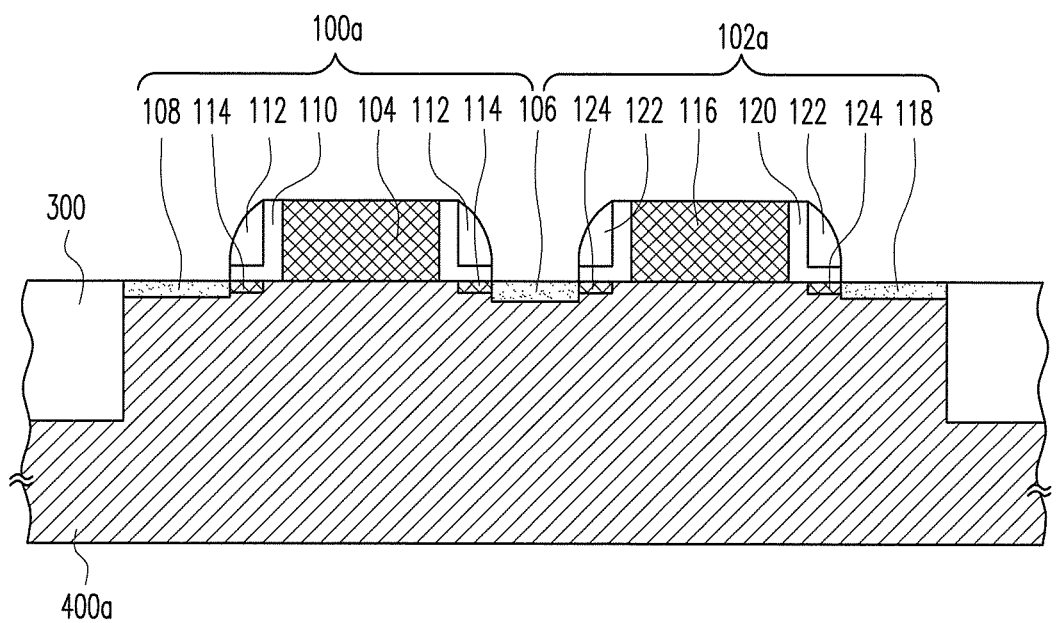
FIGS. 4 and 5 are respectively cross-sectional views illustrating transistor structures according to other embodiments of the invention.
Figure 5:
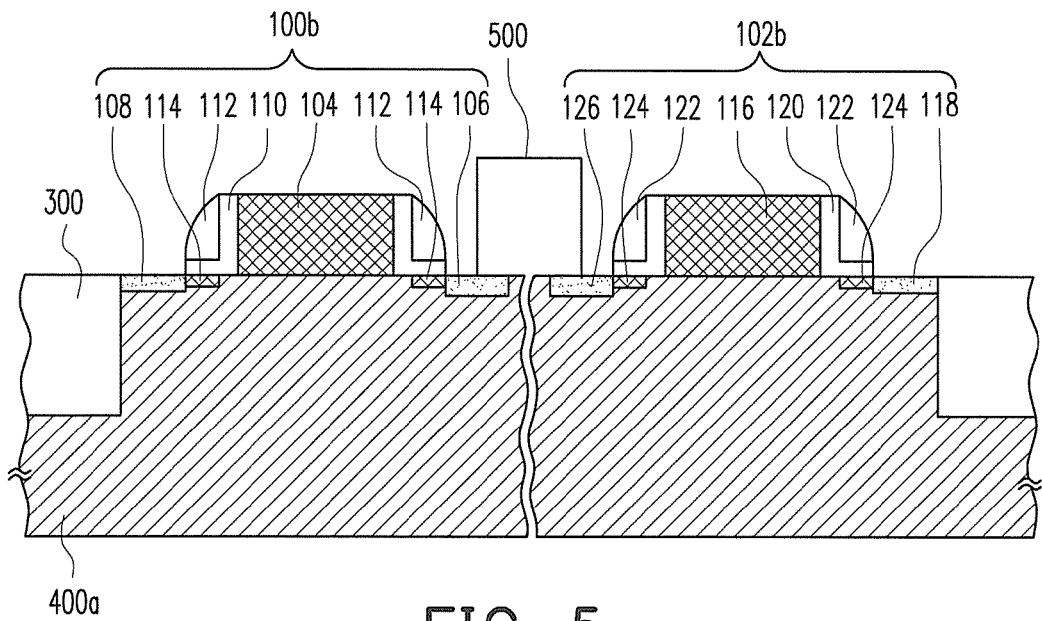

FIGS. 4 and 5 are respectively cross-sectional views illustrating transistor structures according to other embodiments of the invention. In the following, the transistor structures of other embodiments of the invention are described with reference to FIGS. 4 and 5.

Referring to FIG. 4, a transistor structure shown in FIG. 4 differs from the transistor structure shown in FIG. 3 in the following way. In FIG. 4, a substrate 400a does not have the protruding portion 402 shown in FIG. 3. The spacer 112 and the doped extension region 114 of a first transistor 100a are disposed at two sides of the first gate 104, and the spacer 122 and the doped extension region 124 of a second transistor 102a are disposed at two sides of the second gate 116. In the embodiment shown in FIG. 4, the first transistor 100a and the second transistor 102a are cascaded to each other by sharing the first doped region 106 (first terminal), for example.

Referring to FIG. 5, a transistor structure shown in FIG. 5 differs from the transistor structure shown in FIG. 4 in the following way. In the embodiment shown in FIG. 5, a first transistor 100b and a second transistor 102b are cascaded to each other by electrically connecting the first doped region 106 (the first terminal) of the first transistor 100b and a fourth doped region 126 (fourth terminal) of the second transistor 102b. In FIG. 5, the first transistor 100b and the second transistor 102b do not share the first doped region 106 (first terminal). The first transistor 100b includes the first doped region 106 and the second doped region 108 respectively disposed in the substrate 400a at one side and another side of the first gate 104. In addition, the first doped region 106 and the second doped region 108 respectively serve as the first terminal and the second terminal. The second transistor 102b includes a third doped region 118 and the fourth doped region 126 respectively disposed in the substrate 400a at one side and another side of the second gate 116. In addition, the third doped region 118 and the fourth doped region 126 respectively serve as a third terminal and the fourth terminal. The first doped region 106 and the fourth doped region 126 are electrically connected through an interconnect structure 500, for example. A material of the interconnect structure 500 is copper, aluminum, tungsten, or a combination thereof, for example. People having ordinary skills in the art may adjust the number of conductor layers forming the interconnect structure 500 based on the design requirements of the product.

Referring to FIGS. 1 to 3 again, each of the resistive random access memory structure 20 further includes a first word line 128, a second word line 130, a plurality of bit lines 132 and a source line 134.

The first word line 128 is electrically connected to the first gate 104 of the first transistor 100. In this embodiment, the first word line 128 electrically connects the first gates 104 of the first transistors 100 in the same row along an X direction, for example. A material of the first word line 128 is metal, such as copper, aluminum, or tungsten, for example. The first word line 128 is electrically connected to the first gates 104 through an interconnect structure 136. A material of the interconnect structure 136 is copper, aluminum, tungsten, or a combination thereof, for example. People having ordinary skills in the art may adjust the number of conductor layers forming the interconnect structure 136 based on the design requirements of the product.

The second word line 130 is electrically connected to the second gate 116 of the second transistor 102. In this embodiment, the second word line 130 electrically connects the second gates 116 of the second transistors 102 in the same column along a Y direction, for example. A material of the second word line 130 is metal, such as copper, aluminum, or tungsten, for example. The second word line 130 is electrically connected to the second gates 116 through an interconnect structure 138. A material of the interconnect structure 138 is copper, aluminum, tungsten, or a combination thereof, for example. People having ordinary skills in the art may adjust the number of conductor layers forming the interconnect structure 138 based on the design requirements of the product.

The bit lines 132 are respectively electrically connected to the corresponding memory cells 202. A material of the bit lines 132 is metal, such as copper, aluminum, or tungsten, for example. In this embodiment, the bit lines 132 are respectively connected to the nine memory cells 202, for example.

The source line 134 is electrically connected to the third doped region 118 (third terminal) of the second transistor 102. In addition, the third doped region 118 is located at a side of the second gate 116 away from the first gate 104. In this embodiment, the source line 134 electrically connects the third doped regions 118 of the second transistors 102 in the same column along the Y direction, for example. A material of the source line 134 is metal, such as copper, aluminum, or tungsten, for example. The source line 134 is electrically connected to the third doped region 118 through an interconnect structure 140. A material of the interconnect structure 140 is copper, aluminum, tungsten, or a combination thereof, for example. People having ordinary skills in the art may adjust the number of conductor layers forming the interconnect structure 140 based on the design requirements of the product.

The resistive random access memory cell string 200 further includes an interconnect structure 204. The interconnect structure 204 electrically connects first electrodes 206 of the memory cells 202 of the same string, and electrically connect the memory cells 202 to the second doped region 108 (the second terminal) of the first transistor 100. A material of the interconnect structure 204 is copper, aluminum, tungsten, or a combination thereof, for example. People having ordinary skills in the art may adjust the number of conductor layers forming the interconnect structure 204 based on the design requirements of the product.

Each of the memory cells 202 includes the first electrode 206, a second electrode 208, and a variable resistance structure 210. The first electrode 206 is a portion of the interconnect structure 204, for example. The second electrode 208 is disposed on the first electrode 206. The second electrode 208 is a portion of the bit line 132, for example. The variable resistance structure 210 is disposed between the first electrode 206 and the second electrode 208. A material of the variable resistance structure 210 is metal oxide, for example, such as hafnium oxide, magnesium oxide, nickel oxide, niobium oxide, titanium oxide, aluminum oxide, vanadium oxide, tungsten oxide, zinc oxide or cobalt oxide. In addition, the variable resistance structure 210 may further include an insulating layer (not shown), such that the variable resistance structure 210 may function as a diode, thereby being capable of effectively blocking a sneak current and thus avoiding occurrence of disturb.

Based on the above embodiments, it can be known that the resistive random access memory structure 20 is in a configuration of two transistors driving N resistive memory cells (2T-NR). Thus, by using the first transistor 100 and the second transistor 102 cascaded to each other, operational complexity, power consumption, and current leakage are significantly reduced, thereby effectively improving electrical and operational performance. Besides, when the resistive random access memory 10 uses the resistive random access memory cell string 200 according to the embodiments, it does not require performing a deep etching process and a deep filling process during a manufacturing process of the resistive random access memory 10. Thus, the manufacturing process of the resistive random access memory 10 may be directly integrated with an advanced logic process.

Figure 6:
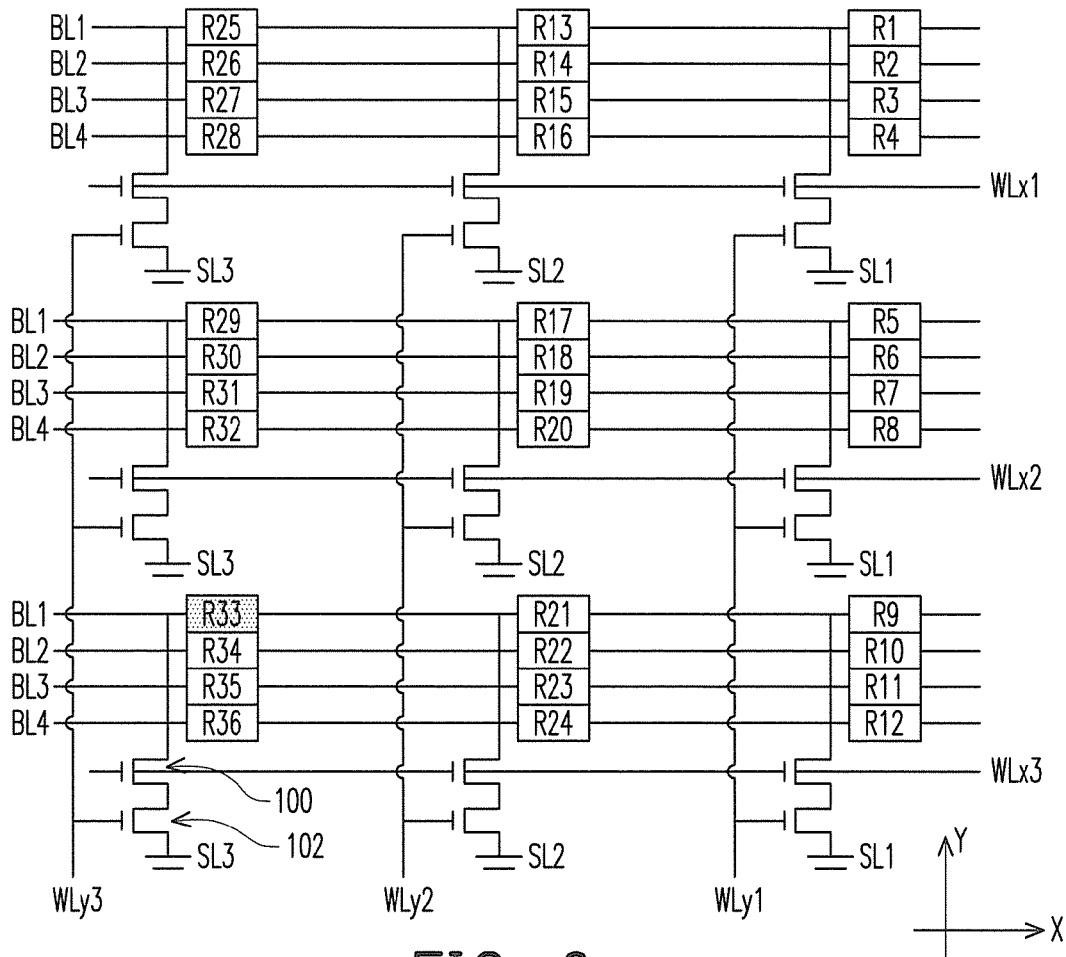
FIG. 6 is a schematic circuit diagram illustrating the resistive random access memory shown in FIG. 1.

FIG. 6 is a schematic circuit diagram illustrating the resistive random access memory shown in FIG. 1.

Referring to FIG. 6, the first word lines 128, the second word lines 130, the bit lines 132, the source lines 134, and the memory cells 202 in the resistive random access memory 10 shown in FIG. 1 are respectively numbered as first word lines WLx1 to WLx3, second word lines WLy1 to WLy3, bit lines BL1 to BL4, source lines SL1 to SL3, and memory cells R1 to R36.

In this embodiment, the memory cell R33 is selected as a subject of operation for further description. A method for operating the resistive random access memory 10 includes connecting the source line SL3 to a ground when performing one of a programming operation, an erasing operating and a reading operation to the memory cell R33. At this time, other source lines SL1 to SL2 that are not connected to the selected memory cell R33 may be connected to the ground as well. Besides, an absolute value of a programming voltage of the programming operation is greater than an absolute value of an erasing voltage of the erasing operation, for example, and the absolute value of the erasing voltage is greater than an absolute value of a reading voltage of the reading operating for example.

Performing the programming operation to the selected memory cell R33 further includes steps in the following. A first turn-on voltage is applied to the first word line WLx3. A second turn-on voltage is applied to the second word line WLy3. The programming voltage is applied to the bit line BL1. The first and second turn-on voltages are voltages capable of turning on the first transistor 100 and the second transistor 102 respectively.

Performing the erasing operation to the selected memory cell R33 further includes steps in the following. A third turn-on voltage is applied to the first word line WLx3. A fourth turn-on voltage is applied to the second word line WLy3. The erasing voltage is applied to the bit line BL1. The third and fourth turn-on voltages are voltages capable of turning on the first transistor 100 and the second transistor 102 respectively.

Performing the reading operation to the selected memory cell R33 further includes steps in the following. A fifth turn-on voltage is applied to the first word line WLx3. A sixth turn-on voltage is applied to the second word line WLy3. The reading voltage is applied to the bit line BL1. The fifth turn-on voltage and the sixth turn-on voltage are voltage capable of turning on the first transistor 100 and the second transistor 102, respectively.

In addition, when performing an operation to the selected memory cell R33, for example, no voltage is applied to other first word lines WLx1 to WLx2, other second word lines WLy1 to WLy2, and other bit lines BL2 to BL4 that are not connected to the selected memory cell R33. In this way, power required is reduced, and a possibility of current leaking is lowered as well, thereby reducing current leakage.

Based on this embodiment, it can be known that when an operation is performed to the selected memory cell R33, the operation may be performed by supplying power to the first word line WLx3, the second word line WLy3, and the bit line BL1, and it is not necessary to apply any voltage to other first word lines WLx1 to WLx2, other second word lines WLy1 to WLy2, and other bit lines BL2 to BL4. Therefore, the operational complexity may be effectively reduced. In addition, by performing an operation to the selected memory cell R33 using the cascaded first transistor 100 and second transistor 102, the power leakage of the transistors is effectively reduced.

This embodiment describes by selecting the memory cell R33 as an example and performing the operations to the memory cell R33 for an illustrative purpose. People having ordinary skills in the art may perform operations to other memory cells (e.g. any one of the memory cells R1 to R32 and R34 to R36) with reference to the operations of this embodiment.

In view of the foregoing, in the resistive random access memory structure and the method for operating the resistive random access memory of the embodiments, the operational complexity, power consumption, and current leakage are significantly reduced by using two cascaded transistors to control the resistive random access memory cell string, thereby effectively improving electrical and operational performance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A resistive random access memory structure, comprising:
   a first transistor and a second transistor, wherein the first transistor and the second transistor are cascaded by electrically connecting a first terminal of the first transistor with the second transistor; and
   a resistive random access memory cell string, comprising a plurality of memory cells electrically connected to each other, and electrically connected to a second terminal of the first transistor.

2. The resistive random access memory structure as claimed in claim 1, wherein the first transistor and the second transistor are cascaded by sharing the first terminal.

3. The resistive random access memory structure as claimed in claim 2, wherein the first transistor comprises:
   a first gate, disposed on a substrate; and
   a first doped region and a second doped region, respectively disposed in the substrate at one side and another side of the first gate, and respectively serving as the first terminal and the second terminal; and
   the second transistor comprises:
   a second gate disposed on the substrate; and
   a third doped region and the first doped region, respectively disposed in the substrate at one side and another side of the second gate, wherein the third doped region serves as a third terminal.

4. The resistive random access memory structure as claimed in claim 3, wherein the substrate comprises a protruding portion, the protruding portion is located between the first gate and the second gate, and the first terminal is located in the protruding portion.

5. The resistive random access memory structure as claimed in claim 1, wherein the first transistor and the second transistor are cascaded by electrically connecting the first terminal of the first transistor and a fourth terminal of the second transistor.

6. The resistive random access memory structure as claimed in claim 5, wherein the first transistor comprises:
   a first gate, disposed on a substrate; and
   a first doped region and a second doped region, respectively disposed in the substrate at one side and another side of the first gate, and respectively serving as the first terminal and the second terminal; and
   the second transistor comprises:
   a second gate disposed on the substrate; and
   a third doped region and a fourth doped region, respectively disposed in the substrate at one side and another side of the second gate, and respectively serving as a third terminal and a fourth terminal.

7. The resistive random access memory structure as claimed in claim 6, wherein the first doped region and the fourth doped region are electrically connected through an interconnect structure.

8. The resistive random access memory structure as claimed in claim 1, wherein each of the memory cells comprises:
   a first electrode;
   a second electrode, disposed on a first electrode; and
   a variable resistance structure, disposed between the first electrode and the second electrode.

9. The resistive random access memory structure as claimed in claim 8, wherein the resistive random access memory cell string further comprises an interconnect structure connecting the first electrodes of the memory cells of the same string.

10. The resistive random access memory structure as claimed in claim 1, wherein the first transistor and the second transistor respectively comprise a metal oxide semiconductor field effect transistor, a bipolar junction transistor, a junction field effect transistor, a metal-semiconductor field effect transistor, or a modulation doped field effect transistor.

* * * * *